(12) United States Patent
Pickard et al.

(10) Patent No.: US 7,298,091 B2
(45) Date of Patent: Nov. 20, 2007

(54) MATCHING NETWORK FOR RF PLASMA SOURCE

(75) Inventors: Daniel S. Pickard, Palo Alto, CA (US); Ka-Ngo Leung, Hercules, CA (US)

(73) Assignee: The Regents of the University of California, Oakland, CA (US)

( * ) Notice: Subject to any disclaimer, the term of this patent is extended or adjusted under 35 U.S.C. 154(b) by 643 days.

(21) Appl. No.: 10/060,826

(22) Filed: Feb. 1, 2002

(65) Prior Publication Data

US 2003/0146803 A1 Aug. 7, 2003

(51) Int. Cl.
*H01J 7/24* (2006.01)

(52) U.S. Cl. .............................. 315/111.51; 156/345.28; 118/723.1

(58) Field of Classification Search ........... 315/111.21, 315/111.41, 111.51, 111.71, 111.81, 111.01–111.91; 118/723 I, 723 MR, 723 MA, 723 AN; 156/643.1, 156/345, 345.28; 250/492.21, 251; 333/17.3, 333/32

See application file for complete search history.

(56) References Cited

U.S. PATENT DOCUMENTS

| | | | | |
|---|---|---|---|---|
| 3,616,405 A | * | 10/1971 | Beaudry | 204/192.12 |
| 3,909,740 A | * | 9/1975 | Clorfeine | 330/287 |
| 4,014,779 A | * | 3/1977 | Kuehnle | 204/298.08 |
| 4,131,533 A | * | 12/1978 | Bialko et al. | 204/298.14 |
| 4,266,166 A | * | 5/1981 | Proud et al. | 315/248 |
| 4,284,490 A | * | 8/1981 | Weber | 204/298 |
| 4,629,887 A | * | 12/1986 | Bernier | 250/251 |
| 4,948,458 A | * | 8/1990 | Ogle | 438/729 |
| 4,952,843 A | * | 8/1990 | Brown et al. | 315/111.81 |
| 5,006,760 A | * | 4/1991 | Drake, Jr. | 315/111.21 |
| 5,086,226 A | * | 2/1992 | Marcus | 250/288 |
| 5,192,896 A | * | 3/1993 | Qin | 315/224 |
| 5,431,799 A | * | 7/1995 | Mosely et al. | 204/298.06 |
| 5,504,341 A | * | 4/1996 | Glavish | 250/492.21 |
| 5,578,165 A | * | 11/1996 | Patrick et al. | 156/643.1 |
| 5,587,226 A | | 12/1996 | Leung et al. | |
| 5,750,987 A | * | 5/1998 | Ichimura et al. | 250/251 |
| 5,807,470 A | * | 9/1998 | Szczyrbowski et al. | 204/298.08 |
| 6,080,271 A | * | 6/2000 | Fujii | 118/723 AN |
| 6,273,022 B1 | * | 8/2001 | Pu et al. | 118/723 I |
| 6,424,232 B1 | * | 7/2002 | Mavretic et al. | 333/17.3 |
| 6,495,963 B1 | * | 12/2002 | Bennett | 315/111.51 |
| 6,583,572 B2 | * | 6/2003 | Veltrop et al. | 315/111.51 |
| 6,887,339 B1 | * | 5/2005 | Goodman et al. | 156/345.28 |

OTHER PUBLICATIONS

"IEEE Standard Dictionary of Electrical and Electronic Terms," ANSI/IEEE Std. 100-1988, Fourth Edition, 1988, p. 478.
Parker, S.P., Editor-in-Chief, *McGraw-Hill Dictionary of Science and Engineering*. McGraw-Hill Book Co., 1984, p. 612.

* cited by examiner

*Primary Examiner*—Wilson Lee
(74) *Attorney, Agent, or Firm*—Fulbright & Jaworski

(57) ABSTRACT

A compact matching network couples an RF power supply to an RF antenna in a plasma generator. The simple and compact impedance matching network matches the plasma load to the impedance of a coaxial transmission line and the output impedance of an RF amplifier at radio frequencies. The matching network is formed of a resonantly tuned circuit formed of a variable capacitor and an inductor in a series resonance configuration, and a ferrite core transformer coupled to the resonantly tuned circuit. This matching network is compact enough to fit in existing compact focused ion beam systems.

24 Claims, 2 Drawing Sheets

MATCHING NETWORK FOR RF PLASMA SOURCE

GOVERNMENT RIGHTS

The United States Government has rights in this invention pursuant to Contract No. DE-AC03-76SF00098 between the United States Department of Energy and the University of California.

BACKGROUND OF THE INVENTION

1. Field of the Invention

The invention relates generally to plasma generators, and more particularly to matching networks for RF driven plasma generators which may be used as ion or electron sources.

2. Description of the Prior Art

Multicusp plasma generators are used in ion (or electron) sources. While the plasma may be generated by a dc filament discharge, an inductively driven plasma generator using an RF antenna in the plasma production chamber is cleaner.

A matching network is needed for operating a plasma generator with an RF power supply. This is to eliminate the reflected power at the power supply/antenna interface so that the maximum power output from the supply is delivered into the plasma generator. The matching network is connected between the external RF power supply and the RF antenna inside the plasma production chamber.

U.S. Pat. No. 5,587,226 shows a plasma ion source with a general representation of a matching network coupling the RF supply to the RF antenna. No specific circuit design and structure are shown.

Matching networks are normally large in size and cannot be incorporated into a compact Focused Ion Beam (FIB) system such as described in U.S. Pat. No. 5,945,677. Thus a design is needed which meets the size requirement for a compact FIB tool.

SUMMARY OF THE INVENTION

Accordingly it is an object of the invention to provide a compact matching network for coupling an RF power supply to an RF antenna in a plasma generator.

The invention is a simple and compact impedance matching network for matching the plasma load to the impedance of a coaxial transmission line and the output impedance of an RF amplifier at radio frequencies. The matching network is formed of a resonantly tuned circuit formed of a variable capacitor and an inductor in a series resonance configuration, and a ferrite core transformer coupled to the resonantly tuned circuit. This matching network is compact enough to fit in existing compact focused ion beam systems.

DETAILED DESCRIPTION OF THE INVENTION

Figure 1:
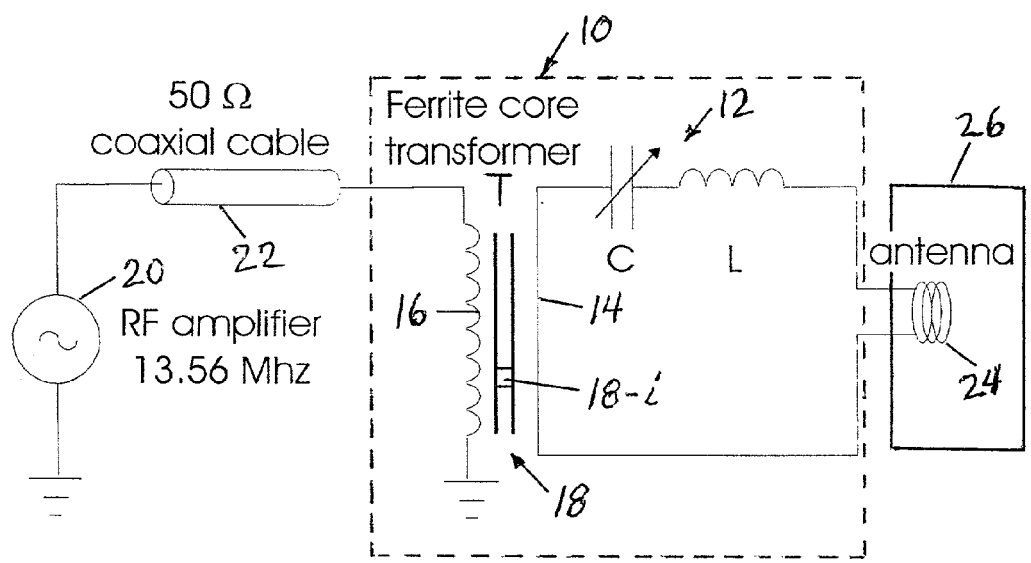
FIG. 1 is a schematic circuit diagram of the RF matching network of the invention.

As shown in FIG. 1, RF matching network 10 is formed of a resonantly tunable circuit 12 connected to a ferrite core transformer T. Tunable circuit 12 is formed of a variable capacitor C and an inductor L in a series resonance configuration. A portion 14 of tunable circuit 12 forms the secondary winding of transformer T, which is typically a single winding. Transformer T also has a multi-turn primary winding 16. Transformer T also has a core 18 which is made of a plurality of ferrite cores 18-$i$.

RF amplifier (RF power supply or source) 20 is connected through 50Ω coaxial cable 22 to the input of matching network 10, i.e. to one end of primary winding 16 whose opposite end is connected to ground. An RF antenna (inductive coil) 24 is connected to the output of matching network 10, i.e. to resonantly tuned circuit 12. RF antenna 24 is positioned inside a plasma generator 26 in which plasma is produced.

A plasma ion source is a plasma generator from which beams of ions can be extracted. Alternatively, an electron beam can be extracted from the plasma by changing the polarity of the extraction voltage. A multicusp plasma ion source has an arrangement of magnets that form magnetic cusp fields to contain the plasma. The plasma generating source is surrounded by columns of permanent magnets. The magnets are placed around the cylindrical side wall as well as an end flange. In most cases an extraction system is placed at an open end.

Multicusp plasma ion sources are illustrated by U.S. Pat. No. 4,793,961; 4,447,732; 5,198,677; 6,094,012, which are herein incorporated by reference.

The transformer T serves two functions. First, it electrically isolates the ion source 26 from the RF amplifier 20, enabling the ion source 26 to float to a potential other than the RF source 20. Second, the turn ratio between the primary windings 16 and secondary winding 14, which typically ranges from 3:1 to 8:1, is selected to transform the plasma impedance to 50Ω. The circuit 12 is tuned to resonance by adjusting the capacitance C; resonance is indicated by a minimum in the reflected power.

An illustrative specific embodiment which was fabricated and tested uses 12 ferrite cores with a 1.25 inch ID and 0.75 inch ID, made of M-type ferrite. The material is chosen with sufficiently high magnetic permeability to contain the field, without significant losses, at the operating frequency, e.g. 2 MHz or 13.56 MHz. The capacitor C was a CACA-175-005 capacitor by Jennings Corp. which is rated at 5kV and has a capacity range of 5-125 pF. The inductor L was made with silver plated copper tubing with approximately 10 turns, each with 1.25 inch OD. A silver plated copper short is provided to reduce the number of turns on the inductor without rewinding it.

Figure 2A:
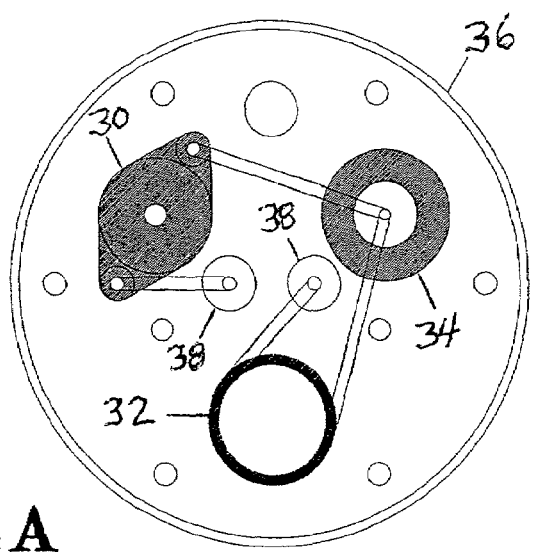
FIGS. 2A, B are top and side views of a compact RF matching network of the invention.
Figure 2B:
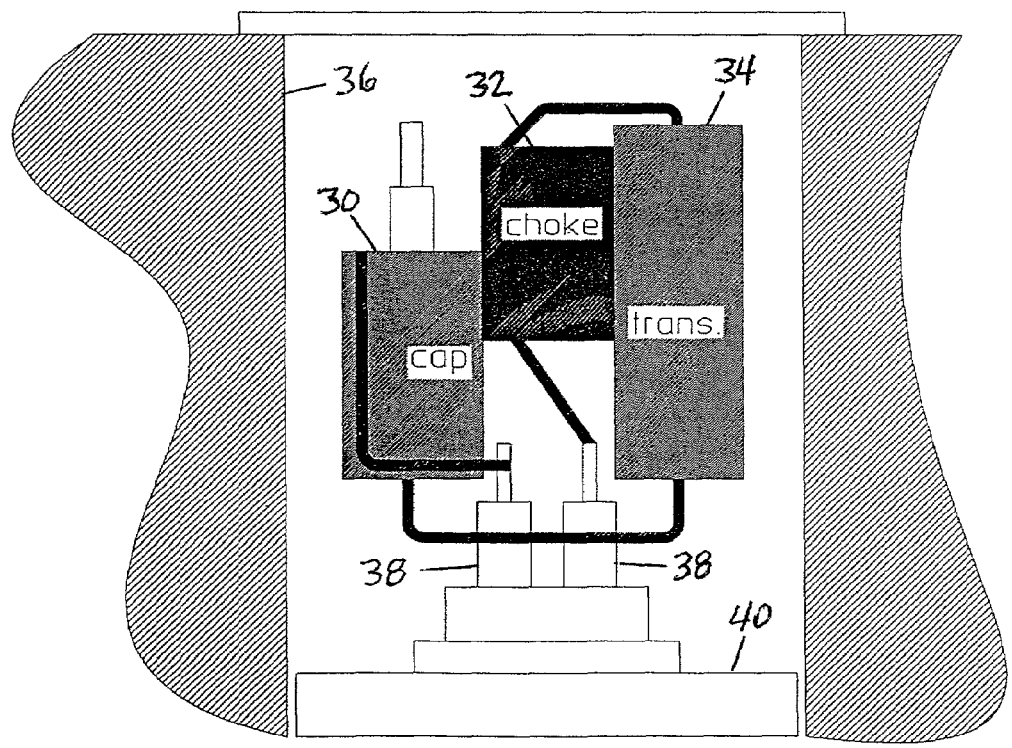

The entire structure, as shown in FIGS. 2A, B, fits within a cylindrical volume 6 inches in diameter and 8 inches long. Adjustable capacitor (C) 30, inductor or choke (L) 32, and transformer (T) 34 are electrically connected and mounted in a cavity 36. The components 30, 32, 34 are electrically connected to the antenna through electrical feedthroughs 38 which pass through base 40. Similarly, there is an electrical connection (not shown) from the primary winding of transformer 34 to the RF amplifier.

Another attractive feature of this system is that it shields much of the RF radiation from escaping into the environment, thereby reducing possible noise on external electronics.

A number of technical problems were overcome to produce the invention. The challenge was to fit a matching network capable of operating with at least 200 W of continuous wave RF power into the existing depression on commercial FIB systems. Design issues included the heating of the ferrite cores and capacitor, and the maximum operating voltage of the capacitor. The system should be matched to run an oxygen plasma at appropriate power levels, e.g. greater than 200 W. Another concern was maintaining adequate distance from the surrounding structure to prevent arcing due to RF voltages.

This technology could be used on any system that uses a plasma source in which the plasma is generated with RF radiation. The specific application for which the matching network was designed is for a focused ion beam system. However, there is presently interest in using a plasma source as a source of electrons. This matching network would work for such a system as well.

Changes and modifications in the specifically described embodiments can be carried out without departing from the scope of the invention which is intended to be limited only by the scope of the appended claims.

The invention claimed is:

1. A matching network for coupling an RF power supply to an RF antenna in a plasma generator, comprising:
   a resonantly tunable circuit formed of a variable capacitor and inductor in a series resonance configuration;
   a ferrite core transformer, said resonantly tunable circuit being connected to one end of a winding of said ferrite core transformer and said RF antenna being connected to another end of the winding of said ferrite core transformer.

2. The matching network of claim 1 wherein the transformer comprises a secondary winding which couples the transformer to both the tunable circuit and RF antenna and a primary winding.

3. A matching network for coupling an RF power supply to an RF antenna in a plasma generator, comprising:
   a resonantly tunable circuit formed of a variable capacitor and an inductor in a series resonance configuration:
   a ferrite core transformer coupled to the resonantly tunable circuit,
   wherein a secondary winding of the transformer is a single-turn winding and a primary winding of the transformer is a multi-turn winding, the secondary winding is coupled to the tunable circuit.

4. A matching network for coupling an RF power supply to an RF antenna in a plasma generator, comprising:
   a resonantly tunable circuit formed of a variable capacitor and an inductor in a series resonance configuration;
   a ferrite core transformer having a single-turn secondary winding and a multi-turn primary winding, and the resonantly tunable circuit being connected to the secondary winding,
   wherein the transformer further comprises a core which is made of a plurality of ferrite cores.

5. A matching network for coupling an RF power supply to an RF antenna in a plasma generator, comprising:
   a resonantly tunable circuit formed of a variable capacitor and an inductor in a series resonance configuration;
   a ferrite core transformer having a secondary winding that couples the transformer to the resonantly tunable circuit, and also having a primary winding,
   wherein the transformer further comprises a core which is made of a plurality of ferrite cores.

6. A matching network for coupling an RF power supply to an RF antenna in a plasma generator, comprising:
   a resonantly tunable circuit formed of a variable capacitor and inductor in a series resonance configuration; and,
   a ferrite core transformer, said resonantly tunable circuit being connected to one end of a winding of said ferrite core transformer, the one end of a winding of said ferrite core transformer being a secondary winding that couples said ferrite core transformer to said resonantly tunable circuit and said ferrite core transformer also having a primary winding,
   wherein the turn ratio between the primary winding and the secondary winding ranges from 3:1 to 8:1.

7. The matching network of claim 6 wherein the turn ratio between the primary winding and the secondary winding is selected to transform the plasma impedance of the plasma generator to 50 Ω.

8. A matching network for coupling an RF power supply to an RF antenna in a plasma generator, comprising:
   a resonantly tunable circuit formed of a variable capacitor and an inductor in a series resonance configuration;
   a ferrite core transformer having a secondary winding that couples the transformer to the resonantly tunable circuit, and also having a primary winding,
   wherein the turn ratio between the primary winding and the secondary winding ranges from 3:1 to 8:1, and the transformer comprises a core made of 12 ferrite cores with a 1.25 inch OD and 0.75 inch ID, made of M-type ferrite.

9. The matching network of claim 8 wherein the variable capacitor has a capacity range of 5-125 pF.

10. The matching network of claim 9 wherein the network fits within a cylindrical volume 6 inches in diameter and 8 inches long.

11. A matching network for coupling an RF power supply to an RF antenna in a plasma generator, comprising:
    a resonantly tunable circuit formed of a variable capacitor and an inductor in a series resonance configuration;
    a ferrite core transformer, said resonantly tunable circuit being connected to one end of a winding of said ferrite core transformer; and,
    an RF power supply connected through a 50 Ω coaxial cable to an input of the matching network and the RF antenna (inductive coil) connected to an output of the matching network.

12. A plasma ion or electron source, comprising:
    an RF power supply;
    a coaxial cable connected to the RE power supply;
    a matching network having an input connected to the coaxial cable, the matching network comprising;
    a resonantly tunable circuit formed of variable capacitor and an inductor in a series resonance configuration;
    a ferrite core transformer, said resonantly tunable circuit being connected to one end of a winding of said ferrite core transformer;
    an RF antenna connected to an output of the matching network;
    a plasma ion or electron generator having the RF antenna mounted therein for inductively generating a plasma.

13. The plasma ion or electron source of claim 12 wherein the transformer comprises a secondary winding which couples the transformer to the tunable circuit and a primary winding.

14. A plasma ion or electron source, comprising:
    an RF power supply;
    a coaxial cable connected to the RF power supply;
    a matching network having an input connected to the coaxial cable, the matching network comprising;
    a resonantly tunable circuit formed of a variable capacitor and an inductor in a series resonance configuration;
    a ferrite core transformer coupled to the resonantly tunable circuit;
    an RF antenna connected to an output of the matching network; and, a plasma ion or electron generator having the RF antenna mounted therein for inductively generating a plasma, wherein a secondary winding of the transformer is a single-turn winding and a primary winding of the transformer is a multi-turn winding, and the secondary winding couples the transformer to the resonantly tunable circuit.

15. A plasma ion or electron source, comprising:

an RF power supply;

a coaxial cable connected to the RF power supply;

a matching network having an input connected to the coaxial cable, the matching network comprising:

a resonantly tunable circuit formed of a variable capacitor and an inductor in a series resonance configuration; and, a ferrite core transformer having a single-turn secondary winding and a multi-turn primary winding, and the resonantly tunable circuit being connected to the secondary winding;

wherein there is an RF antenna connected to an output of the matching network; and, a plasma ion or electron generator having the RF antenna mounted therein for inductively generating a plasma; and, wherein the transformer further comprises a core which is made of a plurality of ferrite cores.

16. The plasma ion or electron source of claim 14 wherein the turn ratio between the primary winding and the secondary winding ranges from 3:1 to 8:1.

17. The plasma ion or electron source of claim 14 wherein the coaxial cable has an impedance of 50 Ω and the turn ratio between the primary winding and the secondary winding is selected to transform the plasma impedance of the plasma generator to 50 Ω.

18. A plasma ion electron source comprising:

an RF power supply;

a coaxial cable connected to the RF power supply;

a matching network having an input connected to the coaxial cable, the matching network comprising:

a resonantly tunable circuit formed of a variable capacitor and an inductor in a series resonance configuration; and, a ferrite core transformer coupled to the resonantly tunable circuit, wherein there is an RF antenna connected to an output of the matching network; and, a plasma ion or electron generator having the RF antenna mounted therein for inductively generating a plasma; and, wherein the plasma ion or electron generator is a multi-cusp plasma generator.

19. The plasma ion or electron source of claim 18 wherein the source is a part of a compact focused ion beam system.

20. The plasma ion or electron source of claim 19 wherein the matching network fits within a cylindrical cavity 6 inches in diameter and 8 inches long.

21. A plasma ion or electron source, comprising:

an RF power supply;

a coaxial cable connected to the RF power supply;

a matching network having an input connected to the coaxial cable, the matching network comprising;

a resonantly tunable circuit formed of a variable capacitor and an inductor in a series resonance configuration;

a ferrite core transformer coupled to the resonantly tunable circuit;

an RF antenna connected to an output of the matching network; and, a plasma ion or electron generator having the RF antenna mounted therein for inductively generating a plasma, wherein the transformer comprises both a single-turn secondary winding that couples the transformer to the tunable circuit and a multi-turn primary winding, and the transformer further comprises a core that is made of a plurality of ferrite cores.

22. A plasma ion or electron source, comprising:

an RF power supply;

a coaxial cable connected to the RF power supply;

a matching network having an input connected to the coaxial cable, the matching network comprising;

a resonantly tunable circuit formed of a variable capacitor and an inductor in a series resonance configuration;

a ferrite core transformer coupled to the resonantly tunable circuit;

an RF antenna connected to an output of the matching network; and, a plasma ion or electron generator having the RF antenna mounted therein for inductively generating a plasma, wherein the plasma ion or electron generator is a multi-cusp plasma generator.

23. The plasma ion or electron source of claim 22 wherein the source is a part of a compact focused ion beam system.

24. The plasma ion or electron source of claim 23 wherein the matching network fits within a cylindrical cavity 6 inches in diameter and 8 inches long.

* * * * *